United States Patent
Yeh et al.

(10) Patent No.: US 10,429,413 B2
(45) Date of Patent: Oct. 1, 2019

(54) COAXIAL PROBE STRUCTURE

(71) Applicant: WIN Semiconductors Corp., Kuei Shan Hsiang, Tao Yuan Shien (TW)

(72) Inventors: Shu-Jeng Yeh, Tao Yuan Shien (TW); Ju-Cheng Yu, Tao Yuan Shien (TW)

(73) Assignee: WIN SEMICONDUCTORS CORP., Tao Yuan Shien (TW)

( * ) Notice: Subject to any disclaimer, the term of this patent is extended or adjusted under 35 U.S.C. 154(b) by 310 days.

(21) Appl. No.: 15/415,377

(22) Filed: Jan. 25, 2017

(65) Prior Publication Data

US 2018/0120349 A1    May 3, 2018

(30) Foreign Application Priority Data

Oct. 31, 2016  (TW) .............................. 105135274 A

(51) Int. Cl.
 *G01R 1/067*  (2006.01)
(52) U.S. Cl.
 CPC ..... *G01R 1/06733* (2013.01); *G01R 1/06716* (2013.01); *G01R 1/06727* (2013.01); *G01R 1/06772* (2013.01)

(58) Field of Classification Search
 CPC ............ G01R 1/06733; G01R 1/06772; G01R 1/06727; G01R 1/06716
 See application file for complete search history.

(56) References Cited

U.S. PATENT DOCUMENTS

| 6,734,689 B1 * | 5/2004 | Yang ................... | G01R 1/06772 324/755.02 |
| 2010/0033201 A1 * | 2/2010 | Hsu ..................... | G01R 1/06744 324/755.05 |
| 2014/0266280 A1 * | 9/2014 | Yeh .......................... | G01R 3/00 324/755.11 |

* cited by examiner

*Primary Examiner* — Amy He
(74) *Attorney, Agent, or Firm* — Muncy, Geissler, Olds & Lowe, PC

(57) ABSTRACT

A coaxial probe structure, comprising: a support member, comprising a first connecting member; a connector, comprising a second connecting member; a coaxial probe, connecting with a connecting end of the coaxial probe to a bottom of the connector, and extending downwards from the bottom of the connector to a probe tip, and an included angle formed at a junction of the probe tip and the connecting end; and an elastic body connecting the support member with the junction of the connecting end and the probe tip of the coaxial probe.

9 Claims, 3 Drawing Sheets

| OD vs. ΔY | | | | | | |
|---|---|---|---|---|---|---|
| OD (μm) | 0 | 10 | 20 | 30 | 40 | 50 |
| ΔY (μm) (with spring) | 0 | 8.4 | 13.8 | 24.6 | 32.5 | 40 |
| ΔY (μm) (without spring) | 0 | 16.3 | 29.1 | 40.3 | 45.7 | 55 |
| OD (μm) | 60 | 70 | 80 | 90 | 100 | |
| ΔY (μm) (with spring) | 47.5 | 58.7 | 65.6 | 70.4 | 76 | |
| ΔY (μm) (without spring) | 63.3 | 69.1 | 76.2 | 85.9 | 93.3 | |

|  | before test Y (mm) | after test Y (mm) | deformation ΔY (mm) |
|---|---|---|---|
| without spring | 21.085 | 21.268 | 0.183 |
| with spring | 21.952 | 21.902 | -0.05 |

FIG. 3

COAXIAL PROBE STRUCTURE

FIELD OF THE INVENTION

The present invention relates to a coaxial probe structure, and more particular to a coaxial probe structure used in high-frequency device testing.

BACKGROUND OF THE INVENTION

The manufacturing process of semiconductor devices can be roughly divided into wafer fabrication, wafer probing and packaging. The wafer probing process includes touching the pads on the wafer with a probe and delivering the test signal from the test station into the wafer through the probe to test various performance of the wafer. The probe structure used in wafer probing should be flexible, so as to keep contacting with the pad when the probe performs touchdowns during the test. The cantilever coaxial probe is currently one of the most commonly available flexible probes structure.

With the development of mobile communication industry, the demand of high-frequency devices in recent years is also growing. In order to reduce the interference of noise in the high-frequency device test, the probe having better noise shielding ability is often used, such as the cantilevered probe made of a coaxial cable. In the production line, the test station may need to perform hundreds of thousands of tests a day, that is, the probe may need to perform hundreds of thousands of touchdowns. Currently, there are a variety of coaxial probes for high frequency wafer probing. However, a common problem of these probes is the vertical deformation of the coaxial probes due to metal fatigue after cyclic touchdowns which cause probe mark shift and unstable contact with the pad.

SUMMARY OF THE INVENTION

Accordingly, in order to solve the foregoing problem, the present invention provides an improved coaxial probe structure, which can effectively improve the deformation problem of the coaxial probe body after a long period of cyclic touchdowns, thereby extending the service life of the coaxial probe. Moreover, the improved coaxial probe structure provided by the present invention is structurally simple and can be applied to currently available coaxial probes without an effort.

To reach the objects stated above, the present invention provides a coaxial probe structure, comprising: a support member, a connector, a coaxial probe, and an elastic body. The support member comprises a first connecting member. The connector comprises a second connecting member for connecting to the first connecting member of the support member. The coaxial probe connects with a connecting end of the coaxial probe to a bottom of the connector and extends downwards from the bottom of the connector to a probe tip, and an included angle is formed at a junction of the probe tip and the connecting end. The elastic body connects the support member with the junction of the connecting end and the probe tip of the coaxial probe.

In implementation, the included angle is larger than 90 degrees and smaller than 180 degrees.

In implementation, the elastic body connects to a junction point of the probe tip and the connecting end.

In implementation, the elastic body is a spring.

In implementation, the elastic body is made of an elastic polymer.

The present invention will be understood more fully by reference to the detailed description of the drawings and the preferred embodiments below.

BRIEF DESCRIPTION OF DRAWINGS

FIG. 3 shows results of performing an overdrive test on an embodiment of the coaxial probe structure provided by the present invention.

DETAILED DESCRIPTIONS OF PREFERRED EMBODIMENTS

Figure 1:
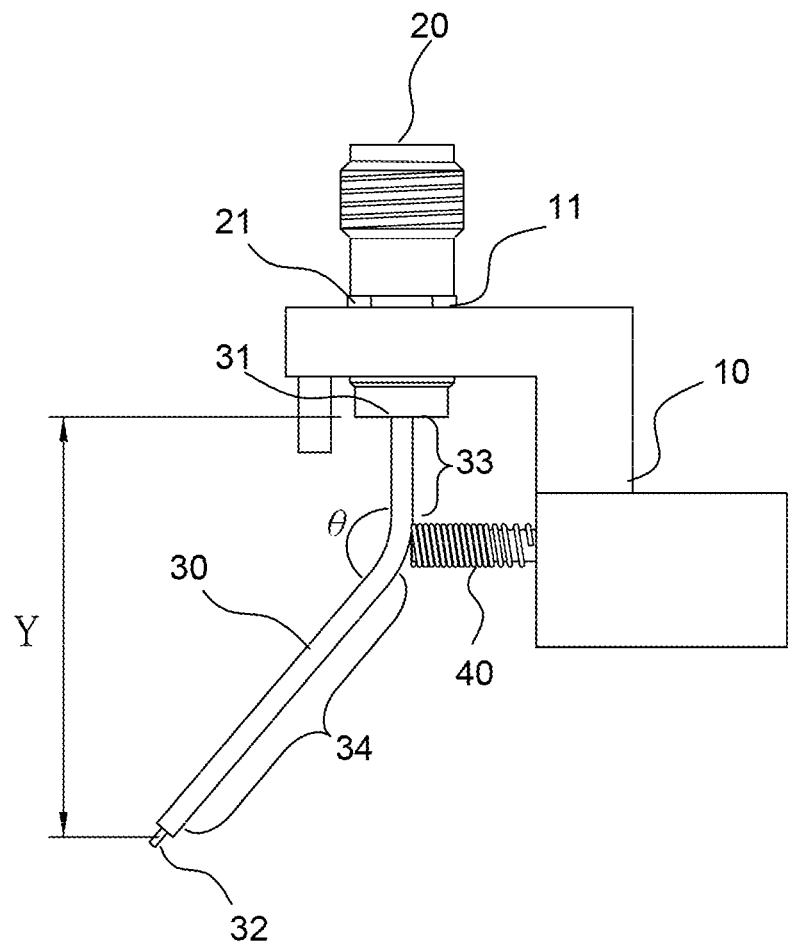
FIG. 1 is a schematic view of an embodiment of a coaxial probe structure provided by the present invention.

FIG. 1 is a schematic view of an embodiment of a coaxial probe structure provided by the present invention, which comprises: a support member 10, a connector 20, a coaxial probe 30, and an elastic body 40. The support member 10 comprises a first connecting member 11. The connector 20 comprises a second connecting member 21 for connecting to the first connecting member 11 of the support member 10. The coaxial probe 30 connects with a connecting end 31 of the coaxial probe 30 to a bottom of the connector 20 and extends downwards from the bottom of the connector 20 to a probe tip 32, and an included angle θ is formed at a junction of the probe tip 32 and the connecting end 31. The elastic body 40 connects the support member 10 with the junction of the connecting end 31 and the probe tip 32 of the coaxial probe 30.

In the coaxial probe structure provided by the present invention, the second connecting member 21 of the connector 20 may be connected to the first connecting member 11 of the support member 10 in various ways to fasten the connector 20 to the support member 10. In one embodiment, the second connecting member 21 is engaged with the first connecting member 11. In another embodiment, the second connecting member 21 is screwed with the first connecting member 11.

The coaxial probe 30 provided by the present invention is formed mainly of a coaxial cable. The coaxial probe 30 connecting with the connecting end 31 of the coaxial probe 30 to the bottom of the connector 20 and extending downwards from the bottom to the probe tip 32, thereby forming a cantilever coaxial probe body using the connecting end 31 as the pivot. The coaxial probe 30 may include structurally plural sections, preferably two sections. The coaxial probe 30 in the embodiment illustrated in FIG. 1 includes a first section 33 and a second section 34, in which the first section 33 includes the connecting end 31 and the second section 34 includes the probe tip 32. An included angle θ is formed at the junction of the first section 33 and the second section 34. The included angle θ is preferably larger than 90 degrees and smaller than 180 degrees. In another embodiment, a third section may be included between the first section 33 and the second section 34, and included angles are formed at the junction of the third section and the first section 33 and the third section and the second section 34, respectively.

The elastic body 40 provided by the present invention can be formed of various elastic substances. In one embodiment, the elastic body 40 is made of an elastic polymer. In another embodiment, the elastic body 40 is a spring. One end of the elastic body 40 connects the support member 10. The other end of the elastic body 40 connects the coaxial probe 30 at a connecting point between the connecting end 31 and the probe tip 32. The connecting point is preferably at the junction of the probe tip 32 and the connecting end 31. As shown in FIG. 1, the elastic body 40 is a spring. One end of the spring connects the support member 10. The other end of the spring connects the junction of the first section 33 and the second section 34, in which the spring connects the coaxial probe 30 preferably in a manner substantially perpendicular to the first section 33.

Figures 2A, 2B:
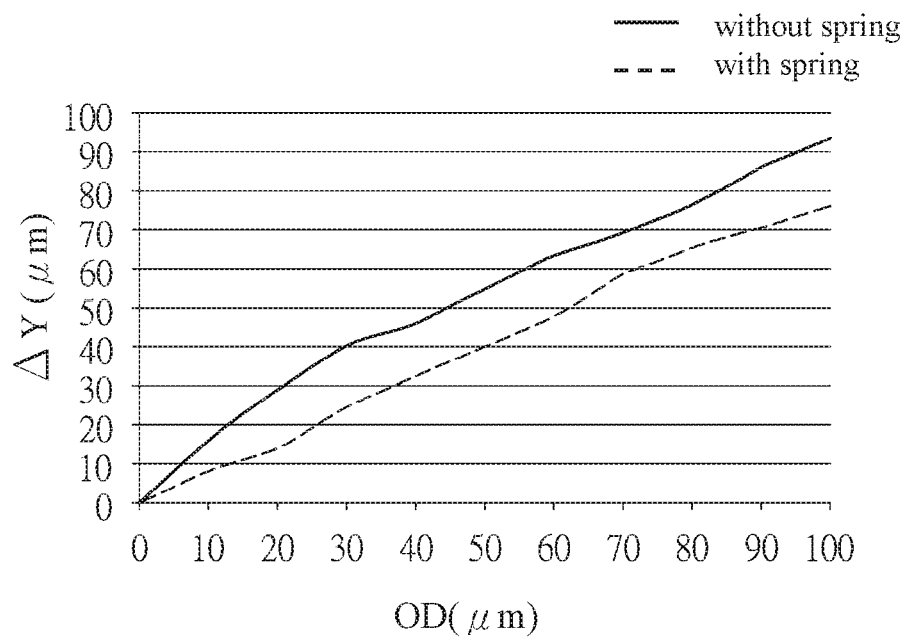
FIGS. 2A and 2B show results of performing an overdrive test on an embodiment of the coaxial probe structure provided by the present invention.

The improvement to the deformation of the coaxial probe body of the coaxial probe structure provided by the present invention can be verified by an overdrive test. FIGS. 2A and 2B show the temporary deformation of the coaxial probe body in the vertical direction by performing an overdrive (OD) test on the embodiment shown in FIG. 1. As shown in FIG. 1, the deformation of the coaxial probe body in the vertical direction is defined by the variation of the distance (ΔY) from the probe tip 32 to the connecting end 31 in the vertical direction (Y-direction). In this embodiment, the elastic body 40 is a spring. FIGS. 2A and 2B show the variation of ΔY with and without the spring. The figure shows that ΔY in the condition with the spring is obviously smaller than in the condition without the spring. FIG. 3 shows the deformation of the coaxial probe body (ΔY) in the vertical direction with and without the spring after 100 thousands of touchdowns with an overdrive (OD) of 20 μm. In this condition, the deformation in the vertical direction can be taken as a permanent deformation. As shown in the figure, the permanent deformation without the spring is 0.183 mm, and the permanent deformation with the spring is −0.05 mm. In this embodiment, the permanent deformation in the condition with the spring is reduced by more than 70%.

The present invention has the following advantages:

1. The improved coaxial probe structure provided by the present invention is structurally simple and easy to implement, and it can be applied to currently available coaxial probes without an effort.

2. The improved coaxial probe structure provided by the present invention effectively improve the deformation problem of the coaxial probe body after a long period of cyclic touchdowns, thereby improving the degree of accuracy of the chip testing and extending the service life of the coaxial probe. The replacement frequency of the probe can thus be lowered, thereby improving the testing efficiency and saving the testing cost.

To sum up, the improved coaxial probe structure provided by the present invention can indeed meet its anticipated objective to effectively improve the deformation problem of the coaxial probe body after a long period of cyclic touchdowns, thereby extending the service life of the coaxial probe. Moreover, the improved coaxial probe structure provided by the present invention is structurally simple and can be applied to currently available coaxial probes without an effort.

The description referred to in the drawings and stated above is only for the preferred embodiments of the present invention. Many equivalent local variations and modifications can still be made by those skilled at the field related with the present invention and do not depart from the spirit of the present invention, so they should be regarded to fall into the scope defined by the appended claims.

What is claimed is:

1. A coaxial probe structure, comprising:
   a support member, comprising a first connecting member;
   a connector, comprising a second connecting member for connecting to the first connecting member of the support member;
   a coaxial probe, connecting with a connecting end of the coaxial probe to a bottom of the connector and extending downwards from the bottom of the connector to a probe tip, and an included angle formed at a junction of the probe tip and the connecting end; and
   an elastic body, having one end connected to the support member and another end connected to the junction of the connecting end and the probe tip of the coaxial probe.

2. The coaxial probe structure according to claim 1, wherein the included angle is larger than 90 degrees and smaller than 180 degrees.

3. The coaxial probe structure according to claim 2, wherein the elastic body connects to a junction point of the probe tip and the connecting end.

4. The coaxial probe structure according to claim 3, wherein the elastic body is a spring.

5. The coaxial probe structure according to claim 3, wherein the elastic body is made of an elastic polymer.

6. The coaxial probe structure according to claim 2, wherein the elastic body is a spring.

7. The coaxial probe structure according to claim 2, wherein the elastic body is made of an elastic polymer.

8. The coaxial probe structure according to claim 1, wherein the elastic body is a spring.

9. The coaxial probe structure according to claim 1, wherein the elastic body is made of an elastic polymer.

* * * * *